United States Patent
Fukukura et al.

[19]

[11] Patent Number: 6,006,425

[45] Date of Patent: *Dec. 28, 1999

[54] ELECTRONIC COMPONENT LAYOUT DETERMINATION METHOD AND A MANUFACTURING METHOD USING THE SAME

[75] Inventors: Toshinobu Fukukura, Gamagori; Hirokazu Usui, Nagoya, both of Japan

[73] Assignee: Nippondenso Co., Ltd., Kariya, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/670,441

[22] Filed: Jun. 26, 1996

[30] Foreign Application Priority Data

Jul. 4, 1995 [JP] Japan ................... 7-168413

[51] Int. Cl.$^6$ ..................... H05K 3/30
[52] U.S. Cl. ............... 29/832; 29/834; 29/836
[58] Field of Search ............. 29/740, 743, 832, 29/834, 836; 209/571, 573, 560, 561, 905, 919

[56] References Cited

U.S. PATENT DOCUMENTS

| 4,127,432 | 11/1978 | Kuwano et al. . |
| 4,598,459 | 7/1986 | Klink et al. . |
| 4,951,388 | 8/1990 | Eguchi et al. . |
| 5,224,325 | 7/1993 | Takahashi et al. ............ 29/834 |
| 5,285,946 | 2/1994 | Tomigashi et al. . |
| 5,402,564 | 4/1995 | Tsukasake et al. ............ 29/832 |

FOREIGN PATENT DOCUMENTS

| 62-15028 | 1/1987 | Japan . |
| 2-97099 | 4/1990 | Japan . |
| 4-262596 | 9/1992 | Japan . |
| 5-23932 | 2/1993 | Japan . |
| 5-104364 | 4/1993 | Japan . |
| 6-149337 | 5/1994 | Japan . |
| 6-216581 | 8/1994 | Japan . |
| 7-022774 | 1/1995 | Japan . |

OTHER PUBLICATIONS

Operating Instructions, Panasert Mk1c(M), (LL) NM–2562C, NM–2565C, Panasonic.

"Publicacion Informes Sobre el estado de la Tecnica", Spanish Official Gazette, Oct. 1, 1998, pp. 6370 and 6377.

*Primary Examiner*—Lee Young
*Assistant Examiner*—Rick Kiltae Chang
*Attorney, Agent, or Firm*—Pillsbury Madison & Sutro LLP

[57] ABSTRACT

An electronic parts layout determination method enables manufacture of a wide variety of electronic products with enhanced efficiency and in a short time. For all kinds of electronic parts selected for the manufacture of all of the electronic products, the electronic parts are divided into a plurality of speed groups based on the allowable rotation speed limits of mounting heads during rotation of a rotary table. The speed groups are subjected to a sequencing procedure. Electronic parts used for manufacture of each type of electronic product are then classified into groups, each group including a different kind of electronic part. The resulting parts groups are further classified into subgroups, each subgroup corresponding to one of the speed groups. These subgroups of electronic parts are arranged in a specific order and electronic parts belonging to each speed group are arranged so that a part having a low frequency of usage is placed near a neighboring speed group.

8 Claims, 5 Drawing Sheets

PRODUCT 1 
PRODUCT 2 
PRODUCT 3

PRODUCT 1　　PRODUCT 2　　PRODUCT 3 ial Application No. Hei-7-168413, the contents
ELECTRONIC COMPONENT LAYOUT DETERMINATION METHOD AND A MANUFACTURING METHOD USING THE SAME

CROSS-REFERENCE TO RELATED APPLICATION

This application is related to and claims priority from Japanese Patent Application No. Hei-7-168413, the contents of which are hereby incorporated by reference.

BACKGROUND OF THE INVENTION

1. Field of the Invention

The present invention relates to an arrangement method for optimizing the layout of electronic parts and components in a storage shelf structure of an automatic electronic parts mounting device and a method for manufacturing a product using such arrangement method.

2. Description of Related Art

An electronic parts mounting device for manufacturing various types of electronic products by mounting a plurality of electronic parts onto respective printed circuit boards includes a mounting unit for installing predetermined electronic parts on printed circuit boards and an electronic parts arrangement shelf unit for supplying electronic parts to the mounting unit. The mounting unit includes a rotary table that can rotate in a horizontal plane. This rotary table is provided with head units arranged around a loop and facing downwards for picking and moving predetermined electronic parts. Each head unit has a predetermined number of suction nozzles facing downwards in a loop arrangement for picking up electronic parts through suction action. The number of head units is determined in accordance with the number of types of electronic parts to be used.

The electronic parts are stored in the parts arrangement shelf unit (hereinafter referred to simply as "the shelf unit") in such a manner that the same type of electronic parts are always arranged at a predetermined position therein. The shelf unit slides horizontally to carry certain electronic parts toward an electronic part mounting position of the mounting unit, thereby allowing the suction nozzles to continuously mount the electronic parts on the printed circuit boards.

When arranging the necessary electronic parts in the shelf unit during the manufacture of electronic products using such electronic parts mounting device, it will be important to determine if the method of arranging such electronic parts in the shelf unit (determining which parts should be placed at which position of the shelf unit) meets the following conditions: (1) manufacturing time (production cycle time) for each electronic product is shortened; and (2) the number of electronic parts replacements when changing the type of electronic product to be manufactured is reduced. Productivity may be enhanced by properly determining the method for arranging the electronic parts in the shelf unit.

Conventionally, the electronic parts layout determination method of arranging the different kinds of electronic parts and components in the shelf unit has been determined merely upon workers' decisions for each product to be manufactured. This is troublesome and time-consuming since there are different layout methods for different products.

Meanwhile, in the electronic parts mounting unit, an allowable rotation speed limit of a head unit is set so that there will be no positional deviations or detachment of the electronic parts being carried from the suction nozzles due to rotation of the head unit. Because of this, it will be impossible to adequately meet the above conditions without taking account of the allowable rotation speed limit.

In addition, as the number of electronic products to be manufactured by one parts mounting device increases, the number of types of electronic parts to be used will increase accordingly. Thus, it will be very difficult for workers to determine the way of arranging the layout of electronic parts that will meet both conditions (1) and (2).

SUMMARY OF THE INVENTION

In view of foregoing problems in the prior art in mind, it is a goal of the present invention to provide an optimal electronic parts layout method which enables an electronic parts mounting device to operate efficiently even if the number and types of electronic parts increase.

Accordingly, one aspect of the present invention provides an electronic parts arrangement method for use in an electronic parts mounting device having a parts feeder unit for continuously arranging and storing a plurality of electronic parts and a parts mounting unit for retrieving the electronic parts from the parts feeder unit and for carrying the electronic parts at allowable speed limits and sequentially attaching predetermined electronic parts to a target object, where the arrangement method includes the steps of classifying the electronic parts into groups based on the allowable speed limits of the electronic parts and arranging the electronic parts in the parts feeder unit in accordance with such groups.

With the present invention, since the parts mounting unit attempts to continuously take the predetermined parts out of a group of electronic parts of the same category, it will be possible to set the resulting operation speed to be equivalent to an optimal limit operation speed for any kind of electronic part. This enables the parts mounting unit to speed up its operation during the manufacture of respective electronic products.

Another aspect of the present invention provides an electronic parts arrangement method wherein the electronic parts are arranged within the respective groups such that electronic parts having lower retrieval frequencies are placed near a border with another group.

In this way, since certain electronic parts that have relatively low frequencies of usage are arranged in the parts feeder unit so that these parts are closer to a predetermined position, it becomes possible to reduce the total number of replacements of electronic parts when manufacturing different types of electronic products.

Furthermore, it is possible to increase the movement speed of the parts mounting unit for moving the respective electronic parts during the manufacture of respective electronic products.

Another aspect of the present invention provides an electronic parts arrangement method for use in an electronic parts mounting device having a parts mounting unit for continuously retrieving and moving a plurality of electronic parts to be sequentially attached to a target object and a parts feeder unit, which can move along a predetermined path, for storing the electronic parts and supplying the parts mounting unit with selected electronic parts selected from the electronic parts. The parts feeder unit moves along the predetermined path so that the electronic parts are carried to a feed position where the parts feeder unit supplies the selected electronic parts to the parts mounting unit and the parts mounting unit sequentially carries the electronic parts at the feed position and moves the electronic parts towards a target object, thereby causing the electronic parts to be sequentially attached thereto. The method includes the steps of classifying kinds of electronic parts selected for manufacturing electronic products into a plurality of speed groups based on an allowable speed limit of the parts mounting unit, the allowable speed limit being set such that the electronic parts are firmly held by the parts mounting unit, sequencing the speed groups, classifying a collection of electronic parts into the speed groups and arranging the speed groups of electronic parts in the parts feeder unit in an order determined in accordance with the sequencing with electronic parts having lower frequencies of retrieval by the parts mounting unit being placed closest to another speed group.

A further aspect of the present invention provides an electronic parts arrangement method for use in an electronic parts mounting device having a plurality of head units having a plurality of suction nozzles for holding electronic parts, a rotary table defining a plane perpendicular to a center axis thereof and rotatable about the center axis thereof with the head units being placed at equal distances around the center axis, an electronic parts arrangement shelf structure for arranging and storing the electronic parts and for moving the electronic parts to a supply position where the electronic parts are picked up by the suction nozzles, and a position determination unit for causing a target object to move to a mounting position to allow the suction nozzles holding the electronic parts to attach them to the target object, where the method includes the steps of classifying kinds of electronic parts selected for manufacturing electronic products based on an allowable speed limit of the head units into a plurality of speed groups, the allowance speed limit being set so that the electronic parts are firmly held by the suction nozzles, sequencing the speed groups, classifying a selected collection of electronic parts used for manufacture of each electronic product into electronic parts groups, classifying the electronic parts groups into subgroups with each of the subgroups corresponding to one of the speed groups and arranging the subgroups of electronic parts in an order determined in accordance with the sequencing with electronic parts having lower frequencies of usage during manufacture of the products being placed closest to another subgroup.

In this way, since the head units rotate while the electronic parts that belong to the same speed group are held and carried by the suction nozzles continuously, any difference between the allowable limit rotation speed of individual electronic parts and the rotation speed of head units can be minimized, thus enabling increases in the rotation speeds of the head units throughout the manufacture of respective electronic products. Moreover, since certain electronic parts of low usage frequency are arranged in the parts shelf structure such that these are placed closer to the boundary of a specific speed group which will be subjected to parts replacements more frequently, it is possible to reduce the total number of replacement of electronic parts during the manufacture of different products. It is thus possible to manufacture more efficiently and in a shorter time an increased variety of electronic products employing different kinds of electronic parts and components.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF PRESENTLY PREFERRED EXEMPLARY EMBODIMENT

A preferred embodiment of the present invention is described hereinafter with reference to the accompanying drawings.

A parts mounting device employing the electronic parts layout method will now be described with reference to the accompanying drawings. The parts mounting device produces a wide variety of electronic products by sequentially mounting different types of electronic components onto printed circuit boards.

Figure 1:
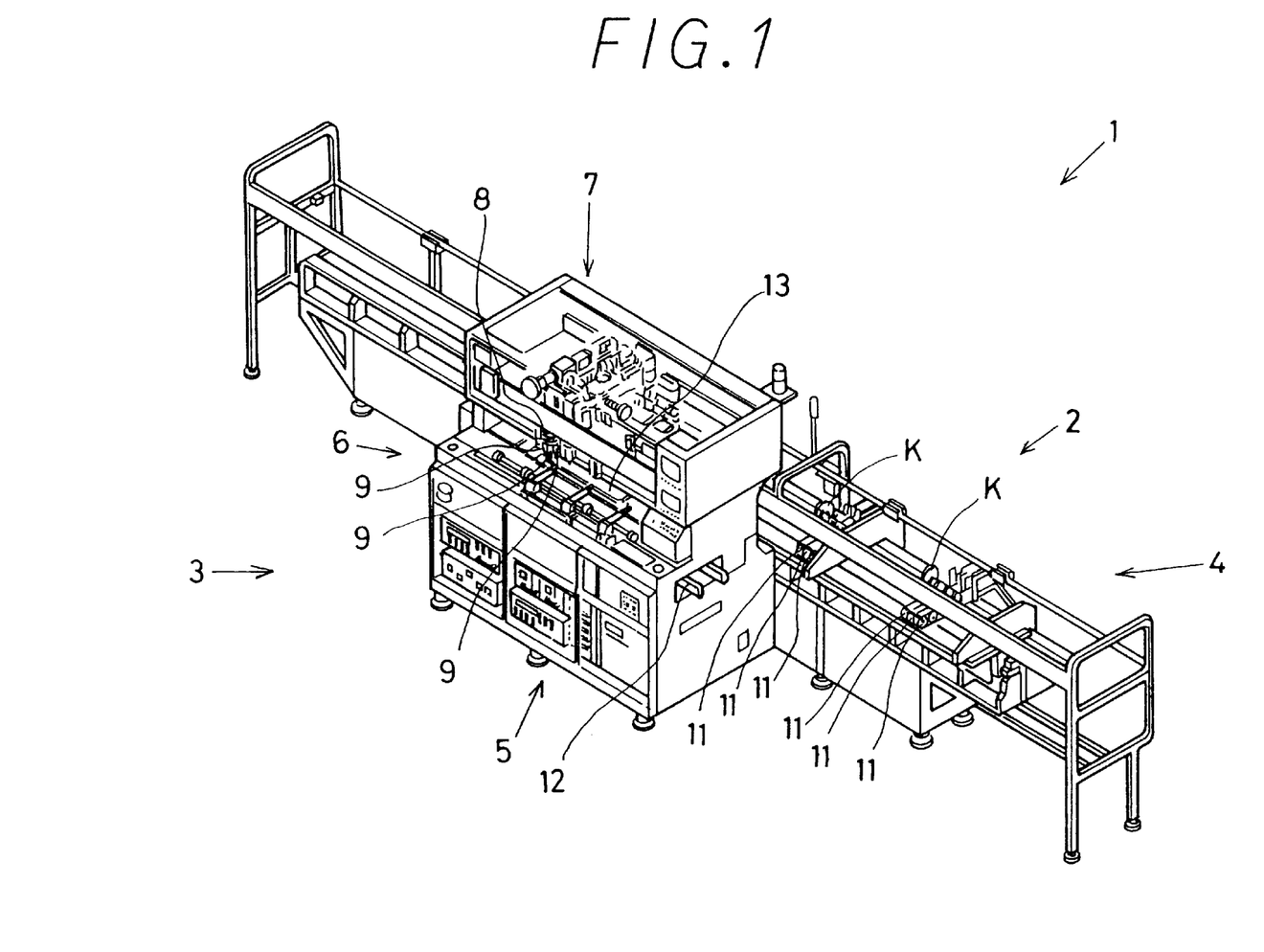
FIG. 1 is a perspective view of an electronic parts mounting device according to an embodiment of the present invention.

As shown in FIG. 1, the automatic parts mounting device 1 includes an electronic parts feeder unit 2 (hereinafter referred to simply as "feeder unit 2") for supplying electronic parts to be installed in an electronic product and a mounting unit 3 for mounting electronic parts supplied by the feeder unit 2 onto a printed circuit board P (shown in FIG. 3). The feeder unit 2 includes an electronic parts storage shelf 4 (hereinafter simply referred to as "shelf 4") for arranging electronic parts, and a driver unit (not shown) for horizontally moving the shelf 4.

The shelf 4 includes a plurality of parallel parts cassettes 11 to which parts band units K (hereinafter referred to simply as band K) for storing the same type of electronic parts are attached.

The mounting unit 3 includes a controller 5 for controlling parts mounting operations, a printed circuit board manipulator 6 installed above the controller 5 for manipulating a PC (printed circuit) board P, and a parts mounter 7 installed above the printed circuit board manipulator 6 for mounting electronic parts supplied from the shelf 4 on the PC board P.

The printed circuit board manipulator 6 is provided with a printed circuit board feeder 12 at a right side thereof for supplying PC boards. The PC board manipulator 6 moves PC boards horizontally and is provided with an X-Y table 13 for adjusting a mounting position of an electronic part on the supplied PC board P.

Figure 2A:
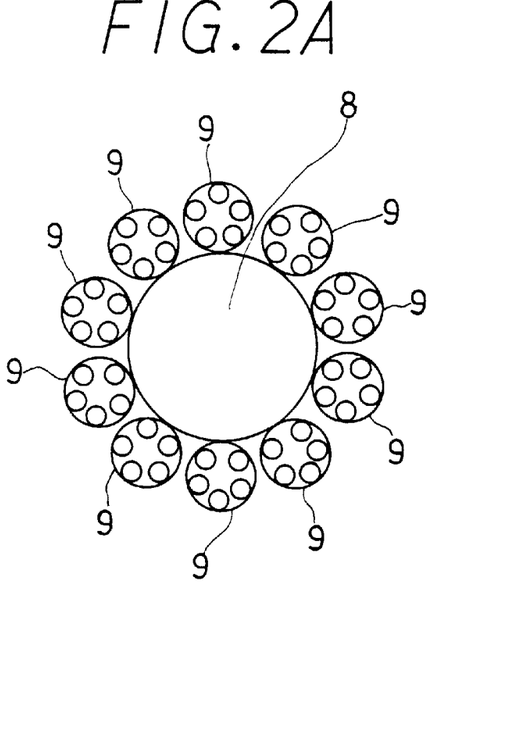
FIG. 2A is a cross-sectional view of a rotary table of a parts mounting unit of the electronic parts mounting device.
Figure 2B:
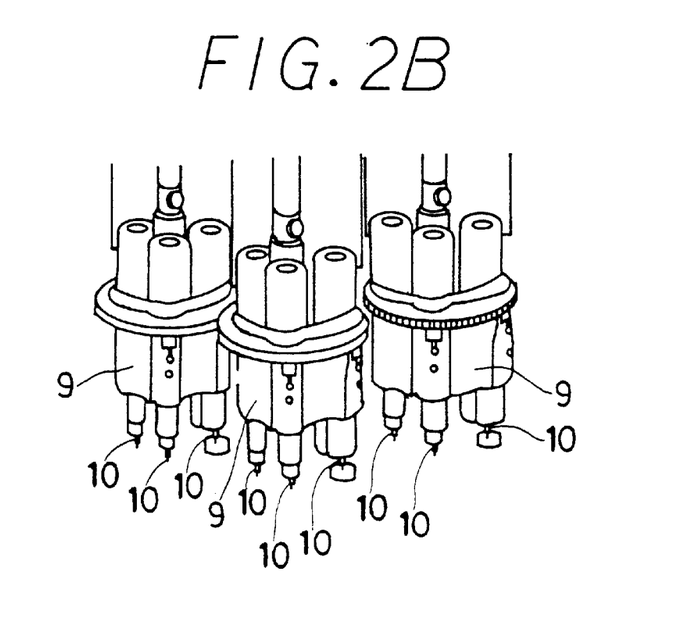
FIG. 2B is a perspective view of a plurality of head units with each head unit having suction nozzles.

The parts mounter 7 includes a rotary table 8 (see FIGS. 2A–2B) that can rotate in a horizontal plane. This rotary table 8 has a lower surface to which a plurality of head units 9, which face downwards, are attached to define a circle for holding electronic parts through suction, moving and carrying such electronic products to respective mounting positions. Each of the head units 9 has a plurality of suction nozzles 10 that define a circle with their suction members being oriented downwards for holding electronic parts through suction action. The number of suction nozzles 10 may be determined based on the number of kinds of electronic parts that will be used.

The parts layout method and the operation of the mounting device 1 are described hereinafter. The bands K are elongated tapes on which the same type of electronic parts are placed at equal intervals. These bands K are prepared for all types of electronic parts and components to be used in the manufacture of all the electronic products.

Electronic products are produced one after another by mounting the respective electronic parts on the respective printed circuit boards of each of the electronic products.

Due to the fact that there are many types of electronic products with each product employing numerous kinds of electronic parts and components, it may be considered impossible to set at one time all parts cassettes 11 attached with bands K of all electronic parts of all electronic products to be produced in the shelf 4. Moreover, the rotary table 8 must be rotated at a selected speed which must be no greater than the allowable limit rotation speed as defined for each individual electronic part to avoid positional deviations or detachment of the electronic parts from the suction nozzles 10 which are holding them during the rotation of the head units 9 when moving such electronic parts.

Accordingly, first, the allowable limit rotation speed of each type of electronic part and frequency of usage of such electronic part throughout the manufacture of all types of electronic products are checked and confirmed. Based on the fact that the frequency of usage of each band K is equal to the frequency of usage of the electronic parts that belong to it, the frequency of usage of each band K is checked.

Subsequently, setting of arrangement ranges of all bands K is carried out.

That is, a range from a minimum value to a maximum value of the allowable rotation speed limit is partitioned into a plurality of speed ranges. Based on its allowable speed limit, a target band K is then classified into a corresponding speed group that has a speed range that encompasses its allowable rotation speed limit. Furthermore, all of the speed ranges are numbered and this number corresponds to the sequential arrangement of the speed ranges in the shelf 4. It must be noted here that the number of allotted slots for attaching the parts cassette 11 in the shelf 4 for each speed range is determined based on a ratio between the number of bands K in each speed range and the total number of bands K.

Next, bands K to be used in the manufacture of the first type of electronic product are placed in accordance with their speed groups in the shelf 4 located at a parts setting position.

The bands K which belong to one speed group and which have been arranged accordingly are collectively called band group U with each band K being attached to respective parts cassettes 11. The parts cassettes 11 attached with the bands K are arranged in the shelf 4 in such as way that the band groups U are within the assigned speed range regions as much as possible.

Here, bands K in band groups U located at opposite ends (U1 and UN of FIG. 3) are arranged in such a way that the higher the frequency of usage of the band K is, the farther the same band K is from the center of the shelf 4. By contrast, the layout of bands K in the remaining, intermediate band groups U2, . . . , UN–1 located between the opposite-end band groups U1, UN is such that the band K having the highest frequency is at or nearest the center of the band group with the rest of the bands K being arranged according to decreasing frequency of usage in a direction away from the center of the band group.

Figure 3:
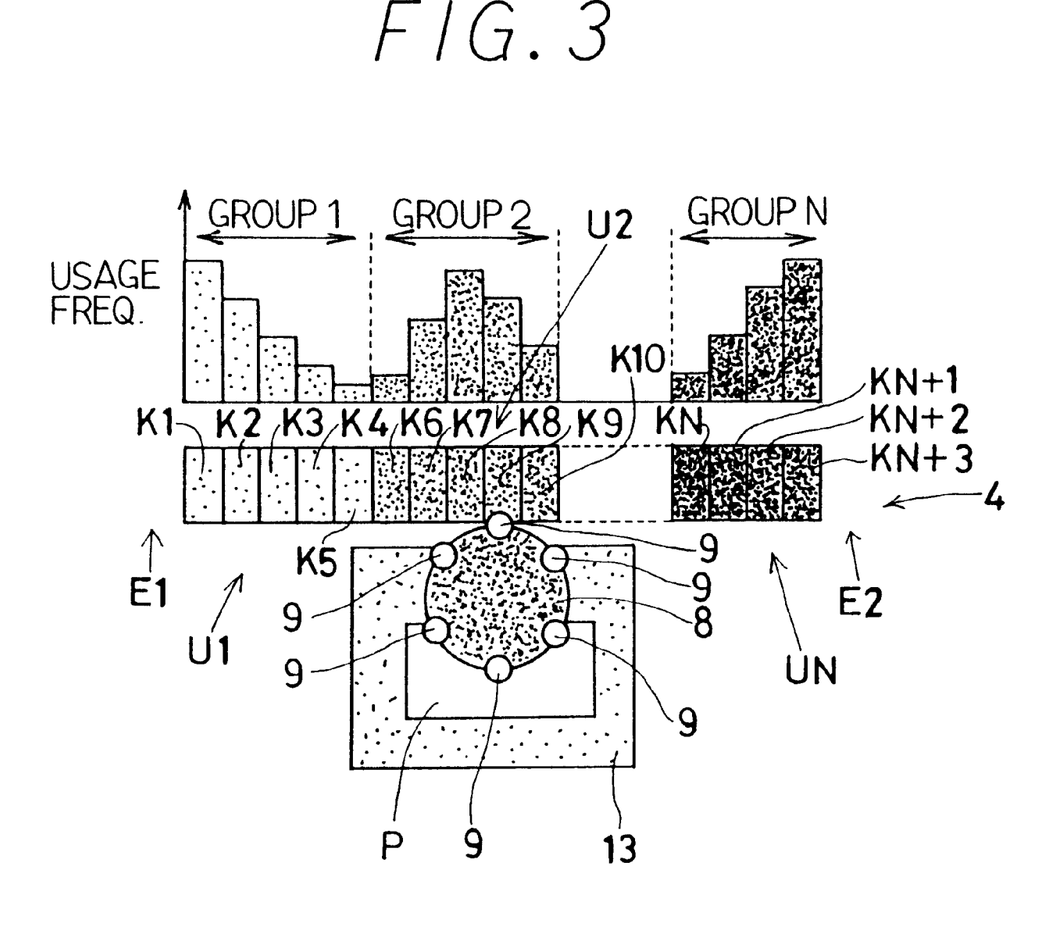
FIG. 3 shows an electronic parts band arrangement when there are N speed groups.

FIG. 3 shows one example of an arrangement of the bands K with the number of speed groups being set to N. In this case, a corresponding number (N) of parts band groups U1, U2, . . . , UN are provided. A first band group U1 includes parts bands K1 to K5 which all belong to a first speed group. It must be noted here that the frequencies of usage of bands K1–K5 are such that K1>K2>K3>K4>K5.

Meanwhile, a second parts band group U2 includes parts bands K6 to K10 which belong to the second speed group. To ensure that a parts band K8 having the highest frequency of usage is at the center of this group U2, these bands are sequentially arranged in a K6→K7→K8→K9→K10 sequence in a direction from a boundary between this second group U2 and the first group U1 towards the other edge E2 of the shelf 4. A similar layout arrangement is used for the bands in the remaining band groups U3 to UN–1 which are associated with the third to N–1th speed groups, respectively.

As shown in FIG. 3, the last parts band group UN includes parts bands KN to KN+3 belonging to the Nth speed group. The frequencies of usage of these bands KN to KN+3 are such that KN+3>KN+2>KN+1>KN. These bands are sequentially positioned in the order of KN→KN+1→KN+2→KN+3 in the direction from the left-side boundary where the band group UN neighbors the previous group UN–1 towards edge E2 of the shelf unit 4.

Next, a PC board P for manufacturing the first type of electronic product is attached to the X-Y table 13. Actuating the suction nozzles 10 causes individual electronic parts and components in respective bands K to be sequentially picked up and carried towards predefined mounting positions in the PC board P. Here, the speed ranges are sequentially designated in such a way that the one adjacent to the end of shelf 4 is first selected. Regarding each speed range, also, the bands K to be used are sequentially designated such that one adjacent to the end of shelf 4 is first selected.

The shelf 4 is then moved horizontally causing the first speed region which is the region nearest to the edge of shelf 4 to approach the rotary table 8, whereby a predetermined parts cassette 11, which is attached with the first band K that is nearest to the end of the shelf 4 and which contains the first type of electric component of the first band group U1 that corresponds to the first speed region, comes at a predetermined position for supplying the corresponding electronic component. At this point, the rotation speed of the rotary table 8 is set to a predetermined value which is equivalent to the minimum speed of the allowable rotation speed limits of the different kinds of electronic parts being presently held and carried by the head units 9.

Then, the rotary table 8 rotates to move a first mount head unit 9 to a target position above a parts feeding position. Moreover, then the first head unit 9 rotates so that a suction nozzle 10 fit for picking up the first component moves to a predetermined pickup position that corresponds to the first electronic component. The suction nozzle 10 picks up the first electronic component. Thereafter, the rotary table 8 rotates to move a second head unit 9 to the predetermined position above the parts feeding position. In case the same first type of electronic component is to be picked up, the second head unit 9 rotates so that a suction nozzle 10 that is the same as the one selected by the first head unit 9 meets the corresponding first electronic part, thus allowing the suction nozzle 10 to pick up the first electronic part. In this way, head units 9 up to the Mth head unit 9 will pick up the first electronic parts through the rotation action of the rotary table 8.

Next, the shelf 4 moves horizontally so that the parts cassette 11 attached with the second band K, which contains the second type of electronic component of the first band group U1 and which is adjacent to the first band K, is at the parts feeding position.

In the same way as that of the first electronic part, the suction nozzles 10 of head units 9 that do not carry any electronic parts, i.e., the head units 9 from M1th (>M) head unit 9 to M2th (>M1) head unit 9, are selected to pick up the second electronic part. In this way, the rotary table 8 rotates to enable the suction nozzles 10 to sequentially pick up electronic parts of the band group U1.

Then, the rotary table 8 rotates so that the first head unit 9 is 180° away from the position directly above the parts feed position. In this way, the first head unit 9 is at an installation position at which electronic parts are to be actually mounted on the PC board P. At the same time, the X-Y table 13 moves causing the PC board P to be at a predetermined position which allows a first mount position of the first electronic component on the PC board P to be directly beneath the installation position. Then, the corresponding suction nozzle 10 is driven to move downward causing the first electronic component to be mounted on its mount position on the PC board P. With the rotation of the rotary table 8, the subsequent head units 9 are sequentially driven to be at the installation position. At the same time, the X-Y table 13 moves the PC board P accordingly, thus forcing respective mount positions of the electronic components to be located directly beneath the installation position so that the electronic parts are mounted one by one from the suction nozzles 10 to the corresponding mount positions on the PC board P. This enables all of the necessary electronic parts of the first band group U1 to be finally installed at the predetermined mount positions on the PC board P.

Thereafter, the shelf 4 is further moved horizontally causing the second speed region to approach the rotary table 8. Also, the rotation speed of the rotary table 8 is set so that the resulting rotation speed is equal to the minimum permissible rotation speed limit among the plurality of electronic parts being presently held by the suction nozzles 10. Then, in a similar way as that of the case of the first speed region, all of the needed electronic parts in the second band group U2 are thus optimally mounted on the predetermined positions of the PC board P.

Furthermore, similar mounting operations are performed with respect to the remaining speed regions, thus completing the production of the first electronic product.

The foregoing steps are repeated to manufacture the needed number of first electronic products.

A concrete example of the above steps is explained in reference with FIGS. 4A–4I which show the steps of manufacturing an electronic product which requires the use of four different electronic products A, B, B, C.

Figure 4A:
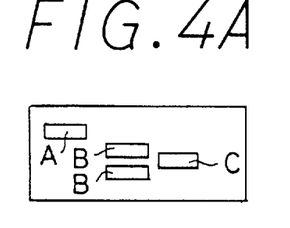
FIGS. 4A–4I show a mounting operation of the parts mounting unit in the embodiment.
Figure 4B:
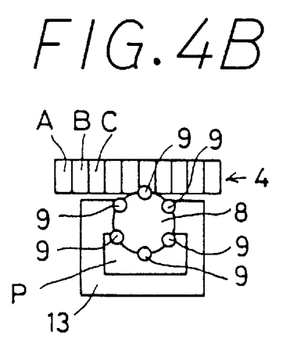
Figure 4C:
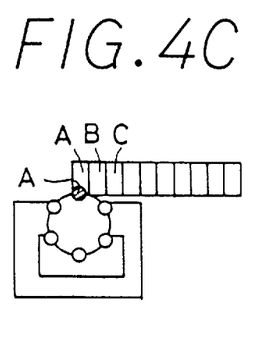
Figure 4D:
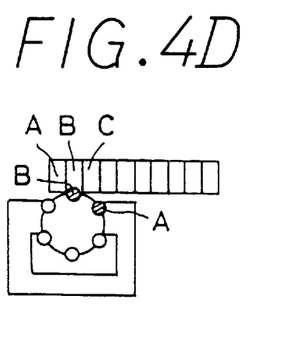
Figure 4E:
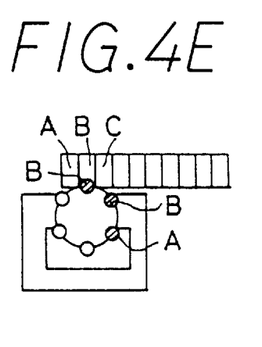
Figure 4F:
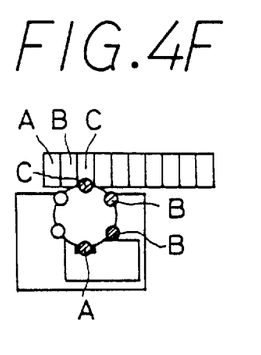
Figure 4G:
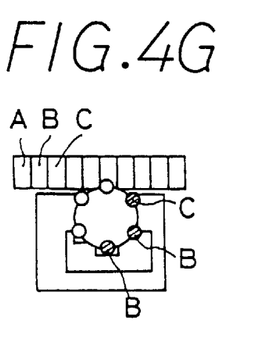
Figure 4H:
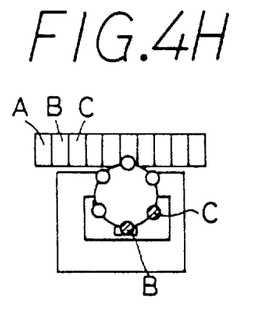
Figure 4I:
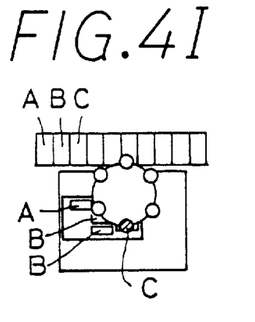

Here, the electronic product shown in FIG. 4A is to be manufactured by sequentially mounting the four electronic parts A, B, B and C. Under these circumstances, the PC board P is first attached to the X-Y table 13 as shown in FIG. 4B. Then, as shown by FIGS. 4C–4F, the shelf 4 is moved horizontally while the rotary table 8 is rotating, causing the electronic parts to be attached in the order of A→B→B→C to the suction nozzles 10 of respective head units 9. During such pickup steps, the X-Y table 13 is driven to move with the rotation of the rotary table 8, causing respective electronic parts to be mounted at their predetermined positions on the PC board P as shown in FIGS. 4F–4I.

Then, by performing necessary replacement or addition of bands K set in the parts cassette 11 of the shelf 4 and located at the parts setting position, those bands K which will be used in manufacture of a second electronic product to be manufactured next are arranged into a plurality of speed groups. Similar to the manufacturing process of the first electronic product, the bands K used in the manufacture of the second electronic product are grouped into band groups U based on the speed groups to which the respective bands K belong. Layout positions will be sequentially determined in such a way that the nearest band to the edge of shelf 4 is first processed.

In the case where a certain parts band group U of the second electronic product correspond to a new speed range which is being used for the first time, i.e., there have been no electronic parts used before that belonged to such a speed range, a suitable number of sequential layout positions are assigned, the number of which corresponds to the number of the bands K of the band group U. In this case, the assignment of such layout positions to the bands K is first performed with respect to those layout positions within the speed range which are not in use. If the number of such layout positions within the speed range is insufficient, one or more layout positions which are not in use are additionally assigned, with such positions being adjacent to either end of the range of layout positions within this speed region. The additional layout positions are selected so that there are no empty spaces between both ends of the speed range and the total number of additional positions from speed ranges bordering both ends of the present speed range equals the number of insufficient positions. In this way, a continuous region is assigned to each entire speed range.

Then, the parts cassettes 11 which are attached with the bands K are arranged so that a distribution pattern of frequency of usage is similar to that during the manufacture of the first electronic product. In this case, if any unnecessary band K is at a layout position, it will be replaced with a parts cassette 11 attached with the needed parts band K.

Similarly, also in the case when one parts band groups U for the second electronic product already corresponds with the respective speed range, a band K is assigned in the following manner so that it is within such a speed range.

One preferable way to attain this is as follows. All bands K of band groups U used in the first electronic product that belong to the same group band U to be used by the second electronic product are left as is. If there are additional bands K, layout positions in the same band group U are assigned to such additional bands with the number of assigned positions being equal to the number of additional bands K. In this case, first of all, the band K in the band group U used in the first electronic product but not in the second electronic product is replaced with another band K which is used by the second electronic product and which belongs to the same band group U. It may be that the presently available unnecessary bands K are insufficient in number; if this is the case, then the layout positions not in use that are adjacent to either end of the band group U are selected and used. In this case, the number of added layout positions must also equal the number of insufficient layout positions.

Next, the parts cassettes 11 which have the additional bands K are assigned to their respective layout positions. At this point, if unnecessary band K are located at the layout positions, then replacements with the necessary part bands shall be first made with the band K having a low frequency of usage. Furthermore, if necessary, a limited or minimal number of replacement operations are performed among the needed bands K being used for production in determining the final layout of bands K in the band groups U for the second electronic product to provide an optimal frequency distribution, which is similar to that during the manufacture of the first electronic product.

Next, in the same way as the case of the first electronic product, a PC board P to be used in the manufacture of the second electronic product is attached to the X-Y table 13, and actuating the suction nozzles 10 causes individual electronic parts to be sequentially selected from respective bands K and then mounted at their target positions on the PC board P.

The necessary number of second electronic products can be produced by repeating the above procedure.

Thereafter, similar procedures will be repeated for determining the optimal layout positions of the bands K in the shelf 4 to enable the manufacture of further types of electronic products.

Moreover, the arrangement of the electronic parts in the shelf 4 during the manufacture of the subsequent electronic products is set by executing the procedure described above.

One concrete example of the arrangement of electronic parts in the shelf 4 is explained hereinafter with reference to FIGS. 5A–5C which show the process of manufacturing three types of electronic products.

Here, electronic parts A to J are used. The allowable limit rotation speed of the head units 9 and the use frequency (lot per month) of these parts are shown in Table 1.

Figure 5A:
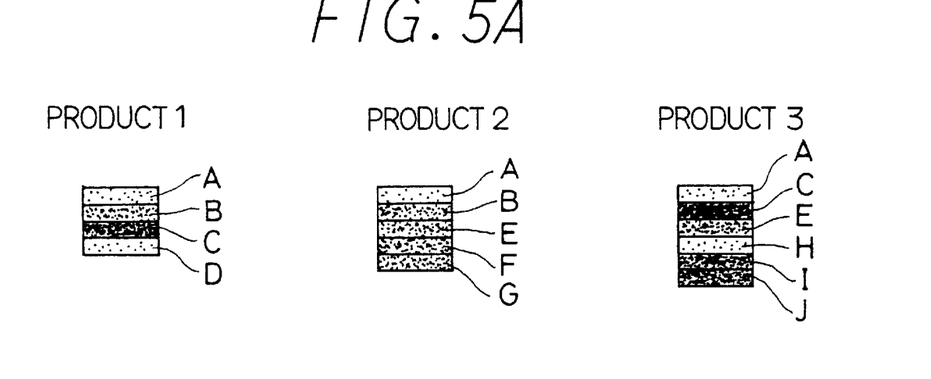
FIGS. 5A–5C shows arrangements of electronic parts and components in the embodiment.
Figure 5B:
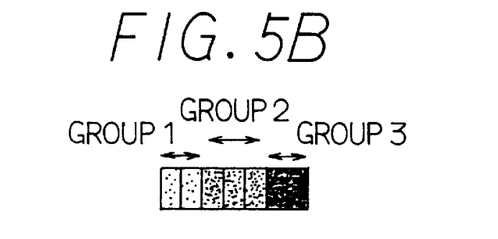
Figure 5C:
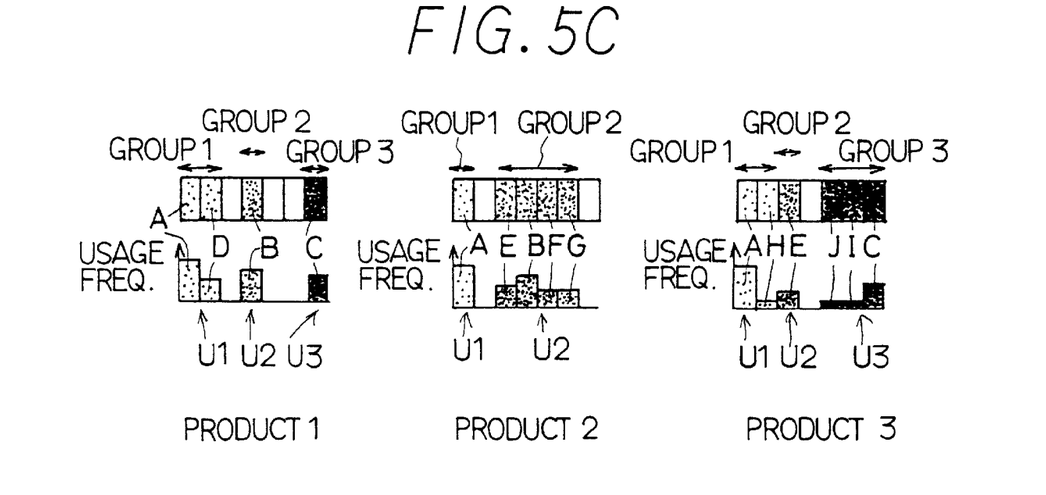

Electronic products 1 to 3 use electronic parts shown in FIG. 5A. The storage area of the shelf 4 is divided into speed 1, speed 2 and speed 3 ranges as shown in FIG. 5B based on the number parts used in electronic products 1 to 3 having speed 1, speed 2 and speed 3 limits. The band K is arranged as shown in FIG. 5C with unnecessary bands K being removed and replaced with the necessary bands K.

Although the present invention has been fully described in connection with a preferred embodiment thereof with reference to the accompanying drawings, it is to be noted that various changes and modifications will become apparent to those skilled in the art. Such changes and modifications are to be understood as being within the scope of the present invention as defined by the appended claims.

TABLE 1

| Electronic Parts | Allowable Rotation Speed Limit of Head | Frequency of Usage (Lot/Month) |
| --- | --- | --- |
| A | Speed 1 | 32 |
| B | Speed 2 | 30 |
| C | Speed 3 | 22 |
| D | Speed 1 | 20 |
| E | Speed 2 | 12 |
| F | Speed 2 | 10 |
| G | Speed 2 | 10 |
| H | Speed 1 | 2 |
| I | Speed 3 | 2 |
| J | Speed 3 | 2 |

What is claimed is:

1. A parts arrangement method for use in a parts mounting device used to manufacture a plurality of different products, said parts mounting device having a parts feeder unit for continuously arranging and storing a plurality of parts associated with said plurality of different products and a parts mounting unit for retrieving said parts from said parts feeder unit and for carrying said parts at allowable speed limits and sequentially attaching predetermined parts to a target object, said method comprising the steps of:
    classifying said parts associated with said plurality of different products into groups based on said allowable speed limits of said parts;
    arranging said parts in said parts feeder unit in accordance with said groups; and
    arranging said parts within each said group based on a retrieval frequency by which said parts mounting unit retrieves said parts for all of said plurality of different products.

2. The parts arrangement method according to claim 1, wherein said parts within each said group are arranged such that parts having lower retrieval frequencies are placed near another group.

3. The parts arrangement method according to claim 2, wherein said parts within each said group are arranged such that parts of a group placed nearest to an end of said parts feeder unit are arranged so that a part having a highest retrieval frequency is nearest to said end.

4. The parts arrangement method according to claim 3, wherein said allowable speed limits are set to prevent said parts from deviating or detaching from said parts mounting unit until said parts are attached to said target object.

5. The parts arrangement method according to claim 2, wherein said allowable speed limits are set to prevent said parts from deviating or detaching from said parts mounting unit until said parts are attached to said target object.

6. The parts arrangement method according to claim 1, wherein said allowable speed limits are set to prevent said parts from deviating or detaching from said parts mounting unit until said parts are attached to said target object.

7. A parts arrangement method for use in a parts mounting device used to manufacture a plurality of different products, said parts mounting device having a parts feeder unit for continuously arranging and storing a plurality of parts associated with said plurality of different products and a parts mounting unit for retrieving said parts from said parts feeder unit and for carrying said parts at allowable speed limits and sequentially attaching predetermined parts to a target object, said method comprising the steps of:
    classifying said parts associated with said plurality of different products into groups based on said allowable speed limits of said parts so that each of said parts belongs to one of said groups; and
    arranging said groups of said parts in predetermined locations in said parts feeder unit, wherein said parts are arranged within said groups based on a retrieval frequency by which said parts mounting unit retrieves said parts for all of said plurality of different products, with a part having a highest retrieval frequency being placed in a middle position of a group to which said part having said highest retrieval frequency belongs.

8. A product manufacturing method for a parts mounting device used to manufacture a plurality of different products, said parts mounting device having a parts feeder unit for continuously arranging and storing a plurality of parts associated with said plurality of different products and a parts mounting unit for retrieving said parts from said parts feeder unit and for carrying said parts at allowable speed limits and sequentially attaching predetermined parts to a circuit board, said method comprising the steps of:
    classifying said parts associated with said plurality of different products into groups based on said allowable speed limits of said parts so that each of said parts belongs to one of said groups;
    arranging said groups of said parts in predetermined locations in said parts feeder unit, wherein said parts are arranged within said groups based on a retrieval frequency by which said parts mounting unit retrieves said parts for all of said plurality of different products, with a part having a high retrieval frequency being placed in a middle position of a group to which said part belongs;
    retrieving said parts using said parts mounting unit; and
    mounting said parts at a predetermined position in said circuit board using said parts mounting unit.

* * * * *